United States Patent [19]
Schlenga et al.

[11] Patent Number: 6,159,444
[45] Date of Patent: Dec. 12, 2000

[54] NMR/MRI WITH HYPERPOLARIZED GAS AND HIGH TC SQUID

[75] Inventors: Klaus Schlenga, Eggenstein, Germany; Ricardo E. de Souza, Recife, Brazil; Annjoe Wong-Foy, Berkeley, Calif.; John Clarke, Berkeley, Calif.; Alexander Pines, Berkeley, Calif.

[73] Assignee: The Regents of the University of California, Oakland, Calif.

[21] Appl. No.: 09/393,406

[22] Filed: Sep. 10, 1999

Related U.S. Application Data

[60] Provisional application No. 60/099,866, Sep. 11, 1998.

[51] Int. Cl.[7] ................................................ A61B 5/055
[52] U.S. Cl. .................................... 424/9.3; 436/173
[58] Field of Search .................. 424/9.3; 600/420; 436/173

[56] References Cited

U.S. PATENT DOCUMENTS

| | | | |
|---|---|---|---|
| 5,545,396 | 8/1996 | Albert et al. | 424/9.3 |
| 6,042,809 | 3/2000 | Tournier et al. | 424/9.3 |
| 6,051,208 | 4/2000 | Johnson et al. | 424/9.3 |
| 6,071,494 | 6/2000 | Unger | 424/9.4 |

*Primary Examiner*—Gary E. Hollinden
*Attorney, Agent, or Firm*—Henry P. Sartorio

[57] ABSTRACT

A method and apparatus for the detection of nuclear magnetic resonance (NMR) signals and production of magnetic resonance imaging (MRI) from samples combines the use of hyperpolarized inert gases to enhance the NMR signals from target nuclei in a sample and a high critical temperature (Tc) superconducting quantum interference device (SQUID) to detect the NMR signals. The system operates in static magnetic fields of 3 mT or less (down to 0.1 mT), and at temperatures from liquid nitrogen (77K) to room temperature. Sample size is limited only by the size of the magnetic field coils and not by the detector. The detector is a high Tc SQUID magnetometer designed so that the SQUID detector can be very close to the sample, which can be at room temperature.

15 Claims, 6 Drawing Sheets

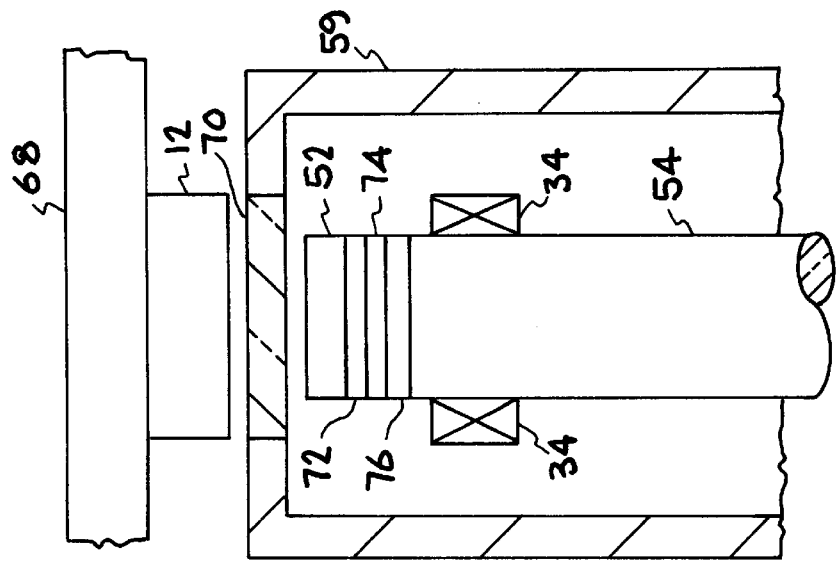
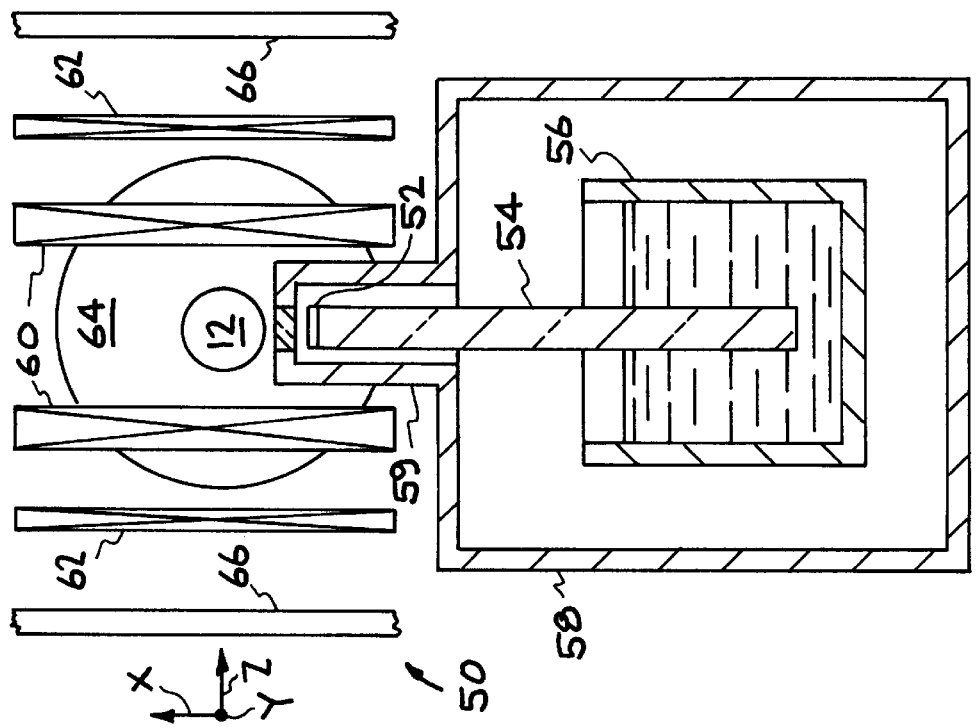
FIG. 2B
FIG. 2A

6,159,444

NMR/MRI WITH HYPERPOLARIZED GAS AND HIGH TC SQUID

RELATED APPLICATIONS

This application claims priority of Provisional Application Ser. No. 60/099,866 filed Sep. 11, 1998, which is herein incorporated by reference.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates generally to nuclear magnetic resonance (NMR) magnetic resonance imaging (MRI), and more particularly to signal enhancement and detection.

Nuclear magnetic resonance (NMR) is a technique for obtaining information about atoms and the molecules they form. NMR operates on atoms having nuclei in which at least one proton or neutron is unpaired. This imbalance causes these nuclei to spin on an axis like miniature tops and gives rise to a magnetic moment, i.e. the nuclei behave like magnets with north and south poles.

When exposed to an external magnetic field, these spinning magnets attempt to align their axes along the lines of magnetic force. The alignment is not exact, however, resulting in a wobbly rotation (precession) about the force lines that is unique for each type of nuclei. If, while exposed to the magnetic field, the nuclei are bombarded with radio (RF) waves, they will absorb and re-emit energy at a specific frequency according to their rate of rotation. This resonating frequency therefore becomes a signature signal by which the nuclei can be identified.

When nuclei absorb the energy of an incoming radio wave, they are knocked out of alignment with the external magnetic field lines. As they subsequently lose this energy, the nuclei come back into alignment. The rate at which resonating nuclei realign themselves with magnetic field lines provides detailed information on their position and motion with respect to neighboring nuclei. This provides a noninvasive technique to study the structural, dynamic, and spatial relationships of atoms in a sample of molecules.

NMR has two basic subsets—spectroscopy and imaging. In NMR spectroscopy, the frequency of the incoming radio wave is varied, and all of the different frequencies absorbed and emitted by the nuclei are measured to obtain a resonance spectrum. This NMR spectrum reveals the molecular makeup of the material down to the respective positions and motions of the constituent atoms.

In magnetic resonance imaging (MRI), the frequency of the incoming radio wave is kept constant, but the strength of the external magnetic field is varied. The resulting signal corresponds to the total number of spinning nuclei present in any part of the sample, i.e. the atomic density of the sample at that point. Information obtained from an array of points can be translated by computer into a recognizable image.

A major problem with NMR is low signal level, which makes the signal difficult to detect and to interpret. The problem is inherent and occurs because the axes will point in either the "up" or "down" (i.e. parallel or antiparallel) direction when the spinning atomic nuclei align themselves with the magnetic field lines. The NMR signals from nuclei pointing in opposite directions cancel one another out. If a sample contained an equal number of nuclei with spins pointing in opposite directions, no NMR/MRI signal would be produced. The degree of spin polarization, i.e. spin axes pointing in a single direction, is very low; the natural population difference between up and down nuclear spins in NMR magnets is usually no more than one in 100,000 at room temperature. A number of techniques have been developed to increase the NMR signal, including multiple quantum NMR, zero field NMR, double rotation NMR, and dynamic angle spinning NMR.

The Spin-Polarization-Induced Nuclear Overhauser Effect (SPINOE) is a technique in which xenon (or other inert) gas is specially treated (hyperpolarized) so that it can amplify the NMR signals from any atomic nuclei with which it makes contact. Xenon is chemically unreactive with other atoms, and readily dissolves in solutions. Xenon atoms show a small degree of natural polarization in their spin, but zapping them with a beam of polarized laser light creates a hyperpolarized effect in which most of the spins point in the same direction. The transfer of polarization from photons to the spins of atomic nuclei is done by the process of optical pumping.

The hyperpolarized xenon nuclei emit a strong NMR signal. When hyperpolarized xenon gas is bubbled into a solution, polarization from xenon nuclei is transferred to the nuclei of atoms in the solution, amplifying their NMR/MRI signals. Every area in a sample accessed by hyperpolarized xenon is going to light up to some extent with an enhanced NMR signal. Through SPINOE NMR, polarization can be transferred from a gas to nuclei on a solid surface so that the surface can be distinguished from the bulk.

A further advantage of hyperpolarized xenon for medical imaging is the aversion of xenon to water so that the hyperpolarized xenon nuclei will concentrate around water free sites, e.g. on a protein, and enhance the resulting NMR/MRI signal. One potential problem with using laser polarized xenon in medical applications is efficiently delivering the xenon while maintaining the large polarization acquired during optical pumping. This has been accomplished by predissolving laser polarized xenon in a biologically compatible solution. The polarized xenon gas is frozen at liquid nitrogen temperature, sublimated, put into a solution, and shaken until dissolved. Following this treatment, loss of polarization during injection became insignificant. Suitable solutions include saline and blood substitutes such as perfluorocarbon emulsions.

The use of hyperpolarized inert gases to enhance NMR/MRI signals is described in U.S. patent application Ser. No. 08/825,475 filed Mar. 28, 1997, which is herein incorporated by reference.

Superconducting Quantum Interference Devices (SQUIDs) are sensitive detectors of magnetic fields based on the quantum mechanical Josephson effect. SQUIDs are based on superconductors, whose resistance drops to zero when cooled to a critical temperature Tc. A SQUID is formed by separating its superconducting material with a very thin insulating barrier through which electron pairs can tunnel. This combination of superconducting material and insulating barrier forms a Josephson junction, i.e. two superconductors joined by a weak link. The SQUID consists of a superconducting ring or square interrupted in two spots by Josephson junction. When sufficient electrical current is applied to the SQUID, a voltage is generated across its body. In the presence of a magnetic field, this voltage will change as the strength of the field changes. Thus the SQUID turns a change in a magnetic field, which is more difficult to measure, into a change in voltage, which is very easy to measure. A high Tc low noise SQUID is described in U.S. Pat. No. 6,023,161 filed Feb. 27, 1998, which is herein incorporated by reference.

For application purposes, SQUIDs are almost always coupled to auxiliary components. To form a magnetometer, a SQUID is connected to a flux transformer, a device consisting of a relatively large loop of superconducting material and a much smaller multiturn coil. Since the large loop picks up a magnetic field over a much greater area, the sensitivity of the SQUID to changes in magnetic field strength is boosted manyfold.

Originally SQUIDs were made with low Tc superconductors, e.g. niobium (Tc=9.5K), which required cooling with liquid helium. More recently, high Tc SQUIDs have been made, using high Tc ceramic oxide superconducting materials, e.g. yttrium barium copper oxide (YBCO) materials (Tc=93K), which only require cooling with liquid nitrogen, which is much less expensive and easier to work with than liquid helium.

Low transition temperature SQUIDs have been used experimentally to detect NMR and nuclear quadrupole resonance (NQR) signals, e.g. Dinh M. TonThat et al., "Direct current superconducting quantum interference device spectrometer for pulsed nuclear magnetic resonance and nuclear quadrupole resonance at frequencies up to 5 MHz," Rev. Sci. Instr. 67, 2890 (1996). Low Tc SQUIDs have been used to image polarized helium and xenon at relatively low fields, e.g. M.P. Augustine et al., "Low field magnetic resonance images of polarized noble gases obtained with a dc superconducting quantum interference device," Appl. Phys. Lett. 72 (15), 1908 (1998). The feasibility of using a high Tc SQUID to detect NMR signals has been demonstrated, S. Kumar et al., "Nuclear magnetic resonance using using a high temperature superconducting quantum interference device," Appl. Phys. Lett. 70 (8), 1037 (1997).

The NMR effect is produced by a spin magnetic moment on nuclei in a sample. A magnetic field causes the spin magnetic moments to precess around the field at the Larmor frequency $\omega$ which is proportional to the magnetic field.

In low field NMR (typically $\leq 10$ mT) the spin precesses at correspondingly low frequencies, typically below 500 kHz, around the field direction. In conventional NMR, in which a resonant circuit is used to detect the precessing magnetization, the induced voltage signal V is proportional to the spin magnetization M and its rate of change (frequency) $\omega$. Since M is also proportional to the frequency $\omega$, V scales with $\omega^2$. As a result it is difficult to detect NMR signals at low fields with a conventional Faraday detector. In contrast, SQUIDs can be used to measure magnetic flux directly, resulting in much higher signal to noise (S/N) ratio at low frequencies. However, it has not been heretofore possible to detect NMR signals from small samples (about 1 ml), at temperatures as high as room temperature, and in magnetic fields as low as 0.1 mT.

SUMMARY OF THE INVENTION

Accordingly it is an object of the invention to provide an improved method and apparatus for magnetic resonance imaging.

It is another abject of the invention to use hyperpolarized inert gas to enhance the MRI signal and a high Tc SQUID to detect the MRI signal.

It is also an object of the invention to provide a method and apparatus for magnetic resonance imaging from small samples (about 1 ml), at temperatures as high as room temperature, and in magnetic fields as low as 0.1 mT.

The invention is a method and apparatus for the detection of nuclear magnetic resonance (NMR) signals and production of magnetic resonance imaging (MRI) from samples which combines the use of hyperpolarized inert gases to enhance the NMR signals from target nuclei in a sample and a high critical temperature (Tc) superconducting quantum interference device (SQUID) to detect the NMR signals. The invention operates in static magnetic fields of 3 mT or less (down to 0.1 mT), and at temperatures from liquid nitrogen (77K) to room temperature. Sample size is limited only by the size of the magnetic field coils and not by the detector. The detector is a high Tc SQUID magnetometer designed so that the SQUID detector can be very close to the sample, which can be at room temperature.

BRIEF DESCRIPTION OF THE DRAWINGS

FIG. 2A is a side view of the liquid nitrogen dewar, SQUID, and coils of the MRI system of the invention.

FIG. 2B is a detailed side view of the sapphire rod, SQUID chip, sapphire window and sample.

FIG. 4A is the spin echo signal and FIG. 4B is the Fourier transform.

FIG. 5A is a plot of the spectrum S(z) and the calculated correction function f(z)

DETAILED DESCRIPTION OF THE INVENTION

Figure 1:
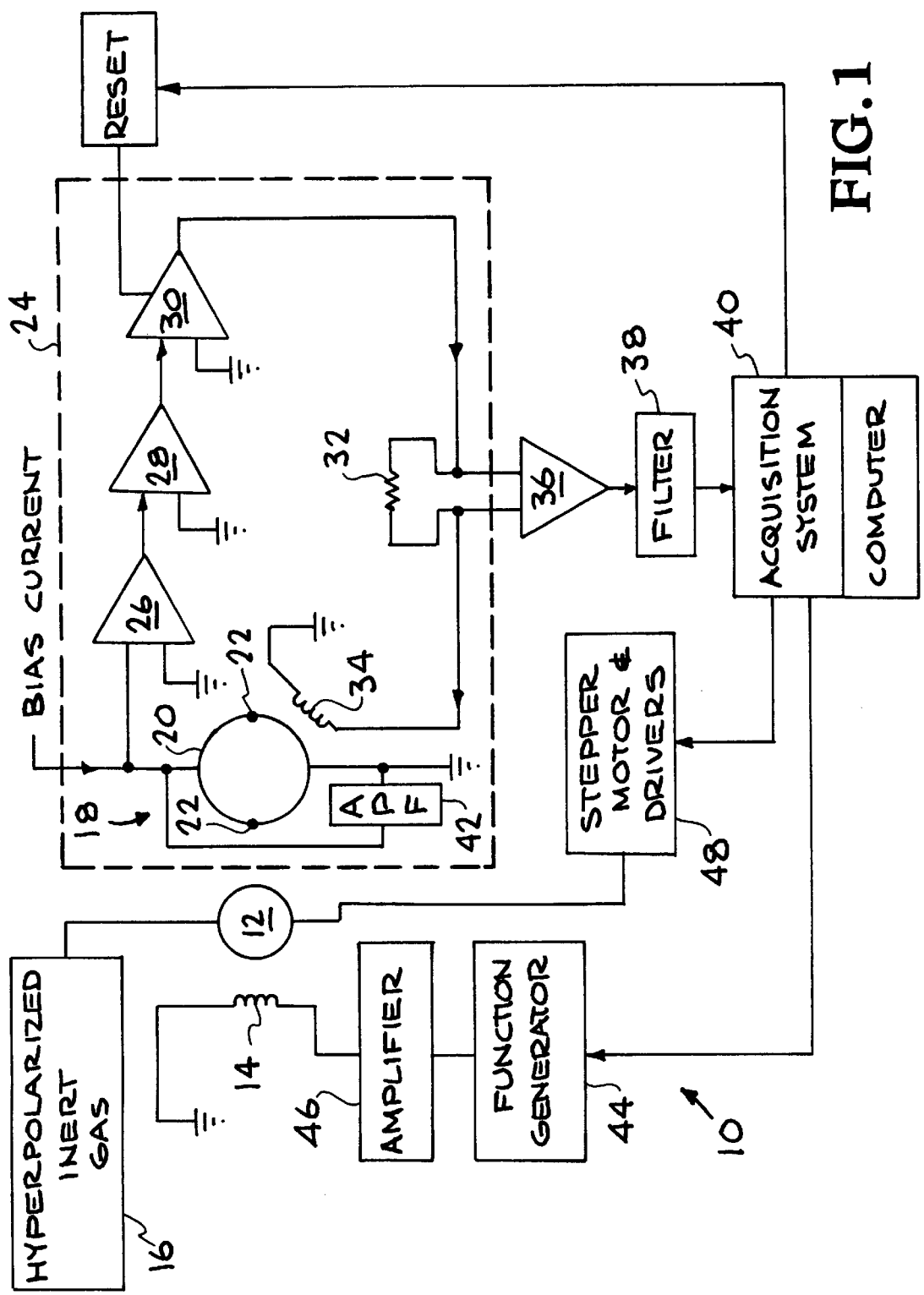
FIG. 1 is a block diagram of the principal components of the MRI system of the invention, showing the introduction of hyperpolarized inert gas into the sample, and the SQUID detector and associated electronics.

The MRI system 10 of the invention, shown in FIGS. 1 and 2A, produces magnetic resonance images of a sample 12. Sample 12 may be any of a wide variety of physical, chemical or biological samples, in solid or liquid form. While the system is particularly adapted to small samples down to about 0.1 ml in size, it can also be applied to much larger samples, including medical examination of humans.

As shown in FIG. 1, sample 12 is positioned near transmitter coil 14 which provides the radio frequency (RF) signal to the sample which is absorbed by the spinning target nuclei and then re-emitted. (The magnetic field coils are shown in FIG. 2A and described below.) Because the nuclei of different chemical elements absorb photons of different frequencies, the presence of a single element in the sample can be detected. When nuclei are irradiated with photons of a frequency that matches their precessional frequency, resonance occurs. The resonant frequency (Larmor frequency) is proportional to the product of the natural rotational velocity (gyromagnetic ratio) characteristic of each species of atomic nucleus and the strength of the applied static magnetic field. The general principles of obtaining NMR signals from precessing nuclei and producing MRI images from the NMR signals are well known in the art, and are utilized in the present invention.

The present invention is directed at particular improvements in an otherwise conventional MRI system to enable operation at low magnetic fields which normally produce low NMR signals. The invention enhances the NMR signal produced, and provides a detector which can better measure low NMR signals.

As illustrated schematically by hyperpolarized inert gas source 16, a hyperpolarized inert gas having a much higher than natural degree of spin polarization is introduced into sample 12. Inert gases such as xenon or helium are hyperpolarized by optical pumping. Shining a beam of circularly polarized light into a glass cell containing xenon gas and rubidium vapor creates a hyperpolarized effect in which the spins of the xenon nuclei predominantly point in the same direction. This hyperpolarization can be transferred to other nuclei, substantially enhancing their NMR signal. The hyperpolarized gas may be injected into the sample, or it may be combined with a suitable carrier and then introduced into the sample. Further details on the use of hyperpolarized gas are found in U.S. patent application Ser. No. 08/825,475 filed Mar. 28, 1997, which is herein incorporated by reference.

In accordance with the invention, a high critical temperature (Tc) superconducting quantum interference device (SQUID) 18 is used to detect NMR signals produced by the sample 12. The NMR signals from sample 12 have preferably been enhanced by adding hyperpolarized inert gas to the sample, but the NMR signals produced by the natural spin polarization of the target nuclei could also be detected by the high Tc SQUID 18. As shown schematically, SQUID 18 is formed of a single loop 20 with two Josephson junctions 22, but a multiloop configuration may also be used. SQUID 18 is preferably configured as a magnetometer. A multiloop high Tc SQUID magnetometer is further described in F. Ludwig et al., "Integrated high-Tc multiloop magnetometer," Appl. Phys. Lett. 66, 1418 (1995), which is herein incorporated by reference. Since the SQUID measures magnetic flux directly, it is highly advantageous over conventional Faraday detectors to detect NMR signals in low fields. Since the SQUID is a high Tc device it greatly simplifies the design and cost, and facilitates examination of samples at higher temperatures, even room temperature.

SQUID 18 is operated in a flux locked loop (FLL) 24. The SQUID is a nonlinear device which is linearized by use of a feedback loop which monitors the SQUID output and supplies a compensating flux to cancel any variation in the input signal. A preamplifier 26 detects the voltage across the SQUID 18. The output of preamplifier 26 passes through a variable gain amplifier 28 and into a single-pole integrator 30. The integrated voltage signal from integrator 30 is passed through a feedback resistor 32 and fed back to SQUID 18 as a magnetic flux via feedback coil 34, which may be a single turn copper wire coil.

The voltage across feedback resistor 32 is passed through a buffer amplifier 36 and filter 38 to a computer (acquisition system) 40. The output of filter 38 is thus the output signal of the SQUID 18 which computer 40 uses to produce MRI images of sample 12. Computer 40 also controls function generator 44 which generates the pulse sequences which are passed through amplifier 46 to transmitter coil 14 to produce the NMR signals. Computer 40 also controls stepper motors and drivers 48 which scan the sample 12 relative to SQUID 18 so that an MRI image of the sample can be produced. For example, stepper motors/drivers 48 may be part of a translation stage on which the sample is positioned.

The noise performance and bandwidth of system 10 could be further improved by the use of an optional additional positive feedback (APF) loop 42 connected to SQUID 18. This would eliminate noise from preamplifier 26. An APF system is desribed in D. Drung et al., "Low noise $YBa_2Cu_3O_{7-x}$ SQUID magnetometers operated with additional positive feedback," Appl. Phys. Lett. 68, 1856 (1996), which is herein incorporated by reference.

FIG. 2A illustrates the structural details of a SQUID magnetometer 50. SQUID chip 52 is positioned at one end of a sapphire rod (cold finger) 54 which extends to a liquid nitrogen reservoir 56. Rod 54 is typically 10 cm long. SQUID chip 52, sapphire rod 54 and reservoir 56 are contained in a vacuum enclosure (dewar) 58. Thus SQUID chip 52 is efficiently cooled; liquid nitrogen is a satisfactory coolant because SQUID chip 52 is a high Tc device. SQUID chip 52 is positioned adjacent the end of a narrow section 59 of vacuum enclosure 58 so that sample 12 may be brought as close as possible. This portion of the structure is further described below with reference to FIG. 2B. Further details of a similar SQUID device are found in T. S. Lee et al., "High-transition temperature superconducting quantum interference device microscope," Rev. Sci. Instr. 67, 4208 (1996) which is herein incorporated by reference.

The sample 12 is also surrounded by the magnetic coils 60, 62 and orthogonal rf coils 64 (which correspond to transmitter coil 14 of FIG. 1) in order to generate the MRI signals. A static magnetic field $B_z$ in the z-direction is produced by a Helmholtz pair of static field coils 60. As an example, coils 60 may each have a diameter of 11.7 cm and 1300 turns; the calculated field homogeneity in the center of these coils is better than 0.07% in a cubic volume of 1 $cm^3$ (0.7% in 8 $cm^3$). External fields can be attenuated by a three layer mumetal shield 66 enclosing the apparatus. For pulsed NMR experiments, an alternating magnetic field By is applied in the y-direction by a Helmholtz pair of transmitter (rf) coils 64 perpendicular to the static field coils 60 (only one is shown). As an example, coils 64 may each have a diameter of 8.6 cm and 20 turns; the calculated field homogeneity in the center of these coils is better than 0.12% in a cubic volume of 1 $cm^3$ (1.2% in 8 $cm^3$). For one-dimensional imaging experiments, an additional gradient field $dB_z/dz$ is applied by a Maxwell pair of gradient field coils 62 parallel to the static field coils 60. As an example, coils 62 may each have a diameter of 12.2 cm and 50 turns; the calculated field homogeneity in the center of these coils is better than 0.3% in a cubic volume of 1 $cm^3$ (1.0% in 8 $cm^3$). All coils are wound from insulated copper wire and mounted on a common rigid frame made from fiberglass and plexiglass.

The details of the dewar structure that allow SQUID chip 52 to be very close to sample 12, e.g. about 1.5 mm or less, are shown in FIG. 2B. The end of dewar section 59 contains a sapphire window 70. SQUID chip 52, which is mounted on the end of sapphire rod 54, e.g. through multiple layers 72, 74, 76, is positioned very close to the inside of window 70. Sample 12, which is shown mounted on a translation stage 68, is positioned very close to the outside of window 70. Thus SQUID chip 52 is inside the dewar and can be cryogenically cooled, while sample 12 is outside the dewar and can be at higher temperature. Feedback (flux modulating) coil 34 (shown in FIG. 1) is also shown as attached to the end of rod 54. For efficient thermal contact between sapphire rod 54, which can be easily cooled, and SQUID chip 52, a special sequence of layers 72, 74, 76 has been used. Layer 76 on the rod end is a thin film of Apiezon N, intermediate layer 74 is a sapphire plate, and layer 72 is Apiezon N or silver paste.

In operation, a sample is positioned between the coils and next to the SQUID. Magnetic fields and rf energy are applied to the sample. The sample is scanned. NMR signals are detected by the SQUID and processed in a computer to produce a MRI image.

A particular example is a pulsed NMR experiment. The following is a typical sequence for a proton spin echo experiment is a field of 2.03 mT. In order to prevent the integrator from being saturated, the feedback loop is switched off during the excitation pulses. The sequence starts with a 90° pulse generated by applying a 793 $\mu$s long 86.6 kHz signal to the transmitter coil. The amplitude is adjusted to produce a field of 14.8 $\mu$T. After a few milliseconds, a 180° pulse with the same field amplitude and frequency but with double the pulse length is applied. Subsequently, because of ringing in the coils, the system is pulsed for about 100 $\mu$s before the feedback loop is switched on. Data acquisition starts 10 $\mu$s later. To allow the spins to relax completely the repetition rate is low, 2.5 Hz.

Figure 3:
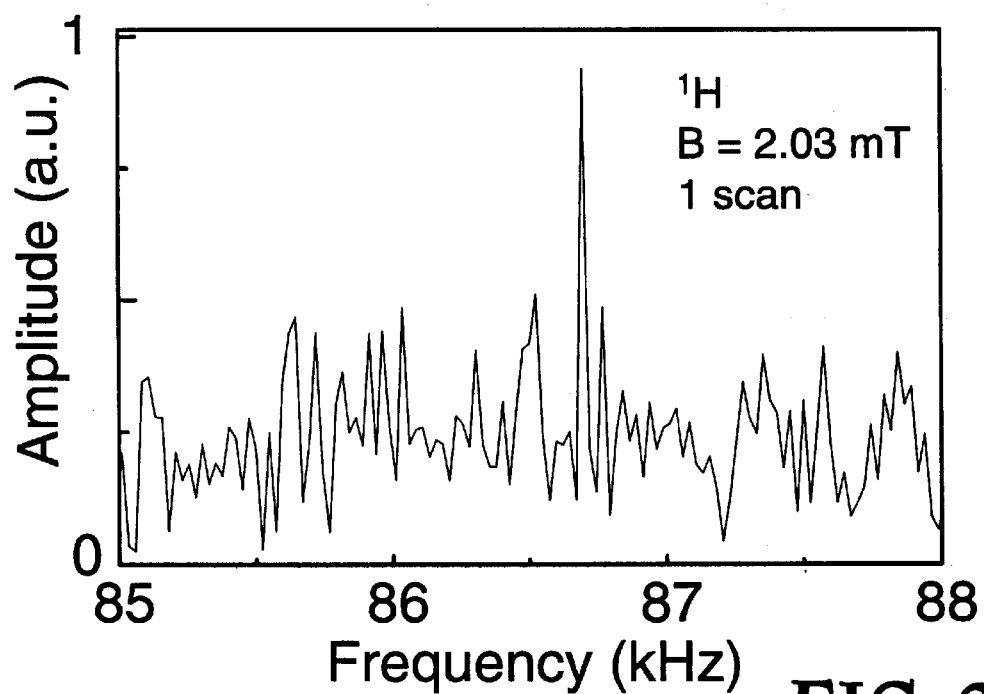
FIG. 3 shows a single shot proton NMR signal (after Fourier transform) from mineral oil in a magnetic field of 2.03 mT.
Figure 4A:
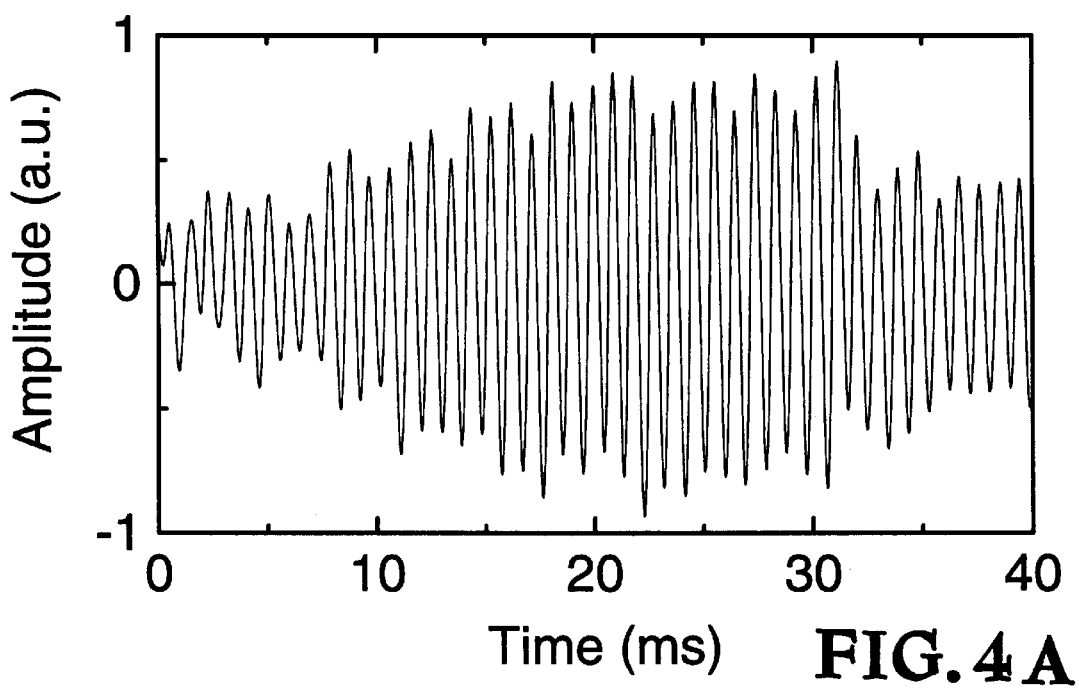
FIGS. 4A, B show the proton NMR signal from mineral oil in a magnetic field of 2.03 mT after 1000 signal averages.
Figure 4B:
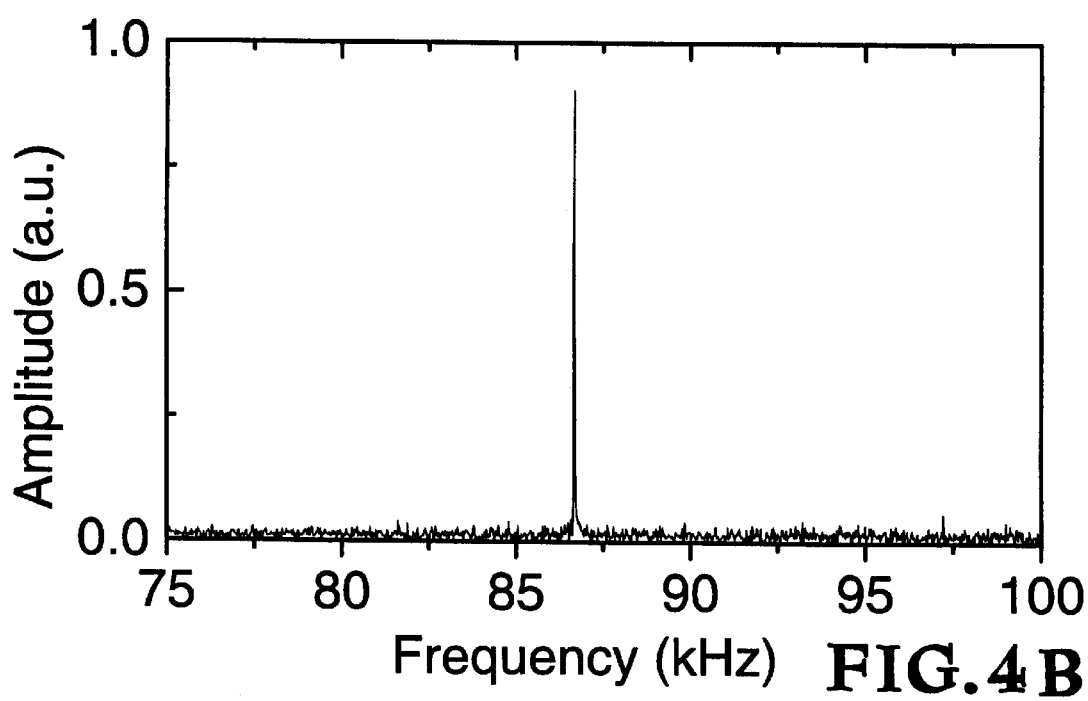
Figure 7:
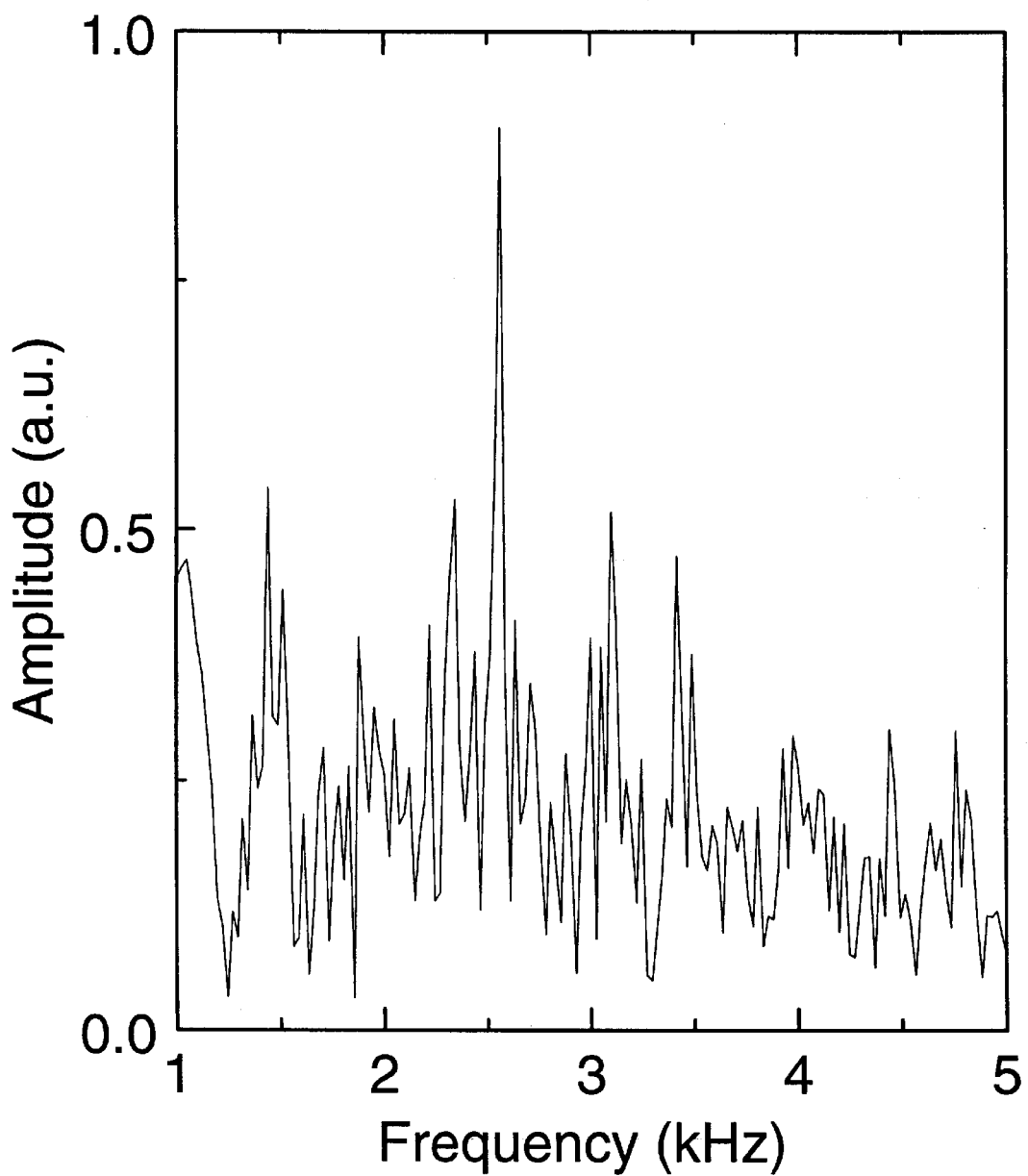
FIG. 7 shows a 2000 times averaged proton NMR signal in a 0.059 mT field.

Experiments have been conducted with a high proton density material (mineral oil). Pulsed NMR experiments with signal averaging provided improved S/N ratio. Most experiments were performed in magnetic fields of 1 mT to 2 mT; frequencies were less than 100 kHz, between 10 kHz and 90 kHz. Proton spin echo signals in 2.03 mT at 86.67 kHz were detected without signal averaging, but higher S/N ratio was obtained by averaging 1000 signals. In a field of 0.059 mT, which is comparable to the earth's magnetic field, the proton spin echo produced by 1 ml of mineral oil at 2.5 kHz was resolved after 2000 averages, as shown in FIG. 7. FIG. 3 shows a single shot proton NMR signal (after Fourier transform) from mineral oil in a magnetic field of 2.03 mT. FIGS. 4A, B show the proton NMR signal from mineral oil in a magnetic field of 2.03 mT after 1000 signal averages; FIG. 4A is the spin echo after the real time signal has been demodulated with 85.6 kHz and filtered and FIG. 4B is the Fourier transform.

Figure 5A:
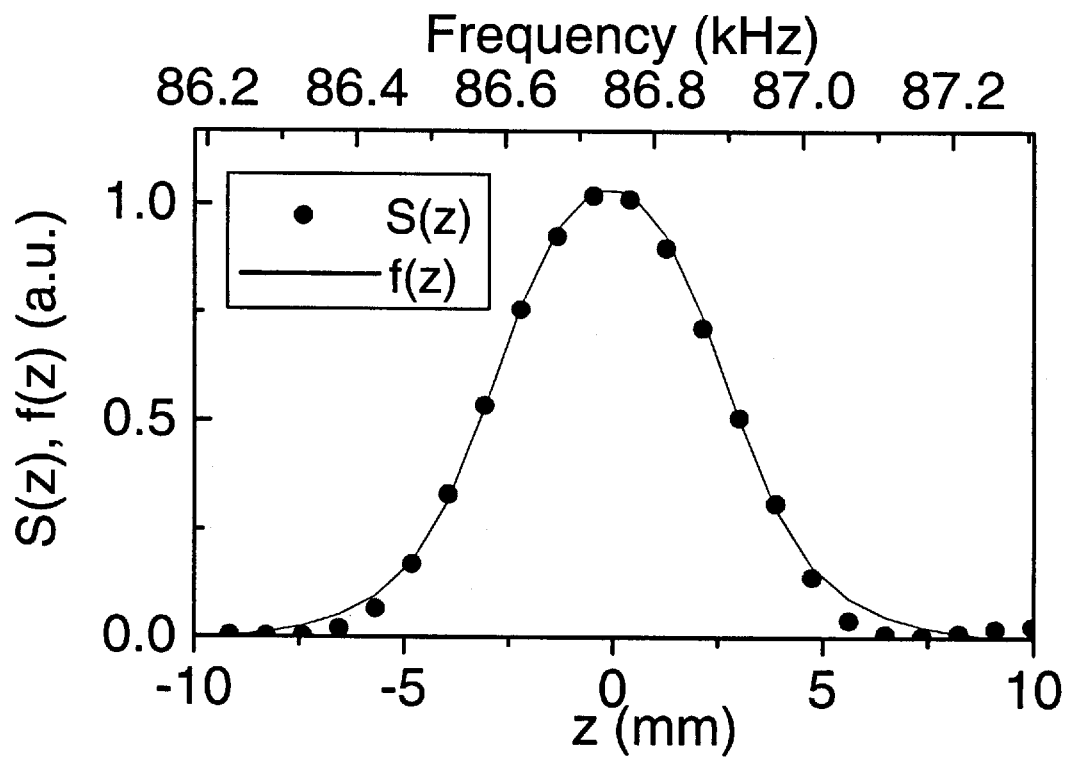
FIGS. 5A, B show the one-dimensional image of a 11 mm wide container obtained by averaging 10,000 proton NMR signals.
Figure 5B:
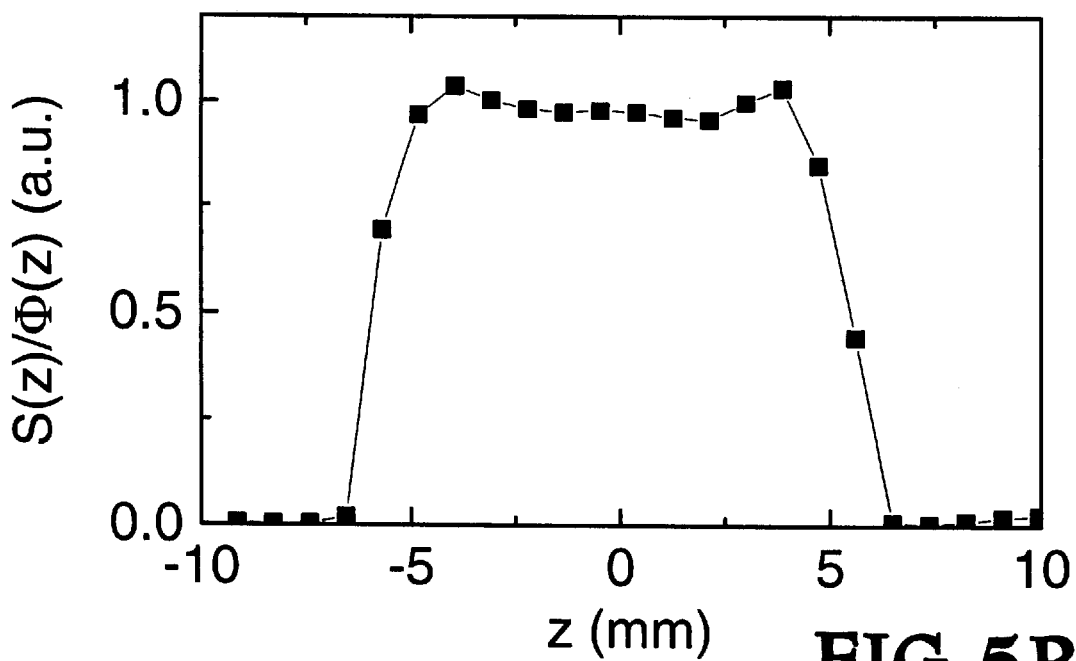
FIG. 5B shows the corrected image S(z)/f(z).

One dimensional images in 2 mT fields were obtained by detecting proton NMR signals. The SQUID magnetometer does not enclose the sample but acts as the surface coil used in conventional NMR. The intensity of the NMR signal from a given part of the sample depends on its position with respect to the magnetometer. To obtain images, a correction function f(z) is calculated:

$$f(z)=\int\int \phi(x,y,z)dxdy, \quad \text{(Eq. 1)}$$

where $\phi(x,y,z)$ describes the contribution of an ensemble of dipoles, localized at coordinates (x,y,z), to the total magnetic flux through the magnetometer. The center of the magnetometer is at (0,0,0). In the present case, on resonance and with the gradient $G=dB_z/dz$ along the direction of the static magnetic field $B_z$, the signal s(k) is given by:

$$s(k)=\int\int\int \phi(x,y,z)\rho(x,y,z)\exp(i2\pi kz)dxdydz, \quad \text{(Eq. 2)}$$

where $\rho(x,y,z)$ is the spin density and $k=\gamma Gt/2\pi$; $\gamma$ is the gyromagnetic ratio. The signal s(k) was measured from a sample of 2.2 ml mineral oil in a rectangular phantom of 1.1 cm×1.1 cm cross sectional area and 1.8 cm height, with a static magnetic field of 2.03 mT and a gradient of about 13.2 $\mu$T/cm. The one-dimensional image of the 11 mm wide container obtained by averaging 10,000 proton NMR signals is shown in FIGS. 5A, B. FIG. 5A is a plot of the spectrum S(z), the Fourier transform of s(k), and the calculated correction function f(z). The position z and frequency f are related as $f=2\pi(f-f_{res})/\gamma G$, where $f_{res}$ is the resonance frequency. FIG. 5B shows the corrected image obtained by dividing S(z) by f(z).

Figure 6:
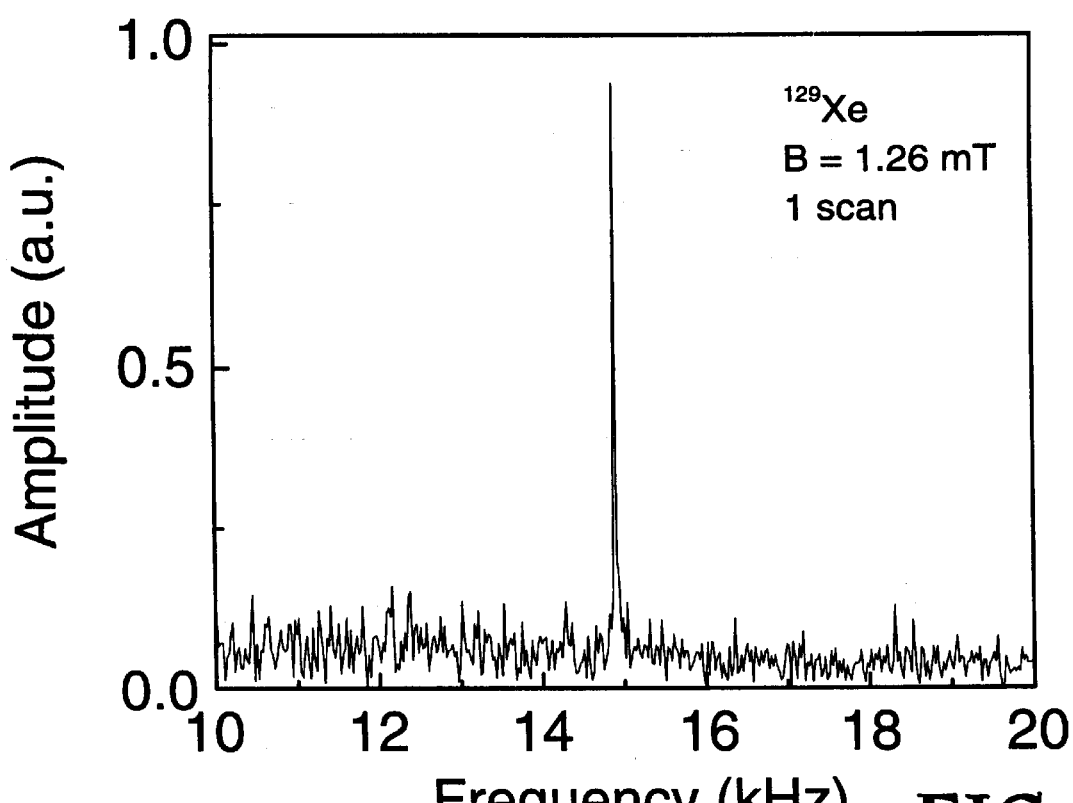
FIG. 6 shows a single shot hyperpolarized Xe-129 NMR signal spectrum.

Experiments on hyperpolarized Xe-129 in a field of 1.3 mT have also been performed. The free induction decay of Xe-129, which has a pumped polarization of 2–3%, was measured with a directly coupled magnetometer after a single 90° pulse. The sample tube was 1.4 cm long and had an inner diameter of 0.5 cm. FIG. 6 shows the single shot Xe-129 NMR signal spectrum.

Thus the invention provides a method and apparatus for magnetic resonance imaging which could be used in a variety of scientific and medical applications. The invention eliminates problems of operating at low fields and high temperatures in a conventional system. The very large magnets which are part of MRI medical imaging systems and which are nonportable, high cost, hazardous and non-localized are not needed. By providing an effective way to polarize the sample, using hyperpolarized inert gas, and by providing an effective detector at low magnetic field, the high Tc SQUID, the invention significantly enhances the ability to perform magnetic resonance imaging.

Changes and modifications in the specifically described embodiments can be carried out without departing from the scope of the invention which is intended to be limited only by the scope of the appended claims.

What is claimed is:

1. A method for magnetic resonance imaging (MRI) of a sample, comprising:

introducing a hyperpolarized inert gas into the sample to transfer spin polarization from the inert gas to target nuclei;

detecting nuclear magnetic resonance (NMR) signals from the target nuclei with a high critical temperature (Tc) superconducting quantum interference device (SQUID);

forming an image from the detected NMR signals.

2. The method of claim 1 wherein the inert gas is hyperpolarized by optical pumping.

3. The method of claim 2 wherein the inert gas is xenon.

4. The method of claim 1 further comprising operating the SQUID in a flux locked mode.

5. The method of claim 4 wherein the output of the SQUID is passed through a preamplifier, an amplifier, and an integrator, and then back to a flux modulating coil positioned near the SQUID.

6. The method of claim 1 further comprising operating the SQUID with additional positive feedback.

7. The method of claim 1 wherein the NMR signals from target nuclei in the sample are produced by applying a magnetic field to the sample and directing radio frequency (RF) waves into the sample.

8. The method of claim 7 wherein the magnetic field is less than about 3 mT.

9. The method of claim 8 wherein the magnetic field is as low as about 0.1 mT.

10. The method of claim 7 wherein the RF waves have a frequency of less than about 100 kHz.

11. The method of claim 1 wherein the SQUID is maintained at liquid nitrogen temperature.

12. The method of claim 11 wherein the SQUID is positioned in a vacuum enclosure containing a liquid nitrogen reservoir.

13. The method of claim 12 further comprising mounting the SQUID on one end of a sapphire rod and immersing the other end of the rod in the liquid nitrogen reservoir.

14. The method of claim 11 further comprising positioning a sapphire window adjacent the SQUID and positioning the sample on the other side of the window.

15. The method of claim 14 wherein the SQUID and sample are separated by a distance of about 1.5 mm or less.

* * * * *